March 26, 1963 B. K. NELSON 3,083,340

PHASE AND FREQUENCY CONTROL SYSTEMS FOR DISCRIMINATORS AND THE LIKE

Filed March 2, 1959 2 Sheets-Sheet 1

BRUCE K. NELSON
INVENTOR.

BY Alden D Redfield
Abraham Ogman

ATTORNEYS.

March 26, 1963
B. K. NELSON
PHASE AND FREQUENCY CONTROL SYSTEMS FOR DISCRIMINATORS AND THE LIKE
3,083,340

Filed March 2, 1959
2 Sheets-Sheet 2

BRUCE K. NELSON
*INVENTOR.*

BY Alden D Redfield
Abraham Ogman

ATTORNEYS

United States Patent Office 3,083,340

Patented Mar. 26, 1963

3,083,340

PHASE AND FREQUENCY CONTROL SYSTEMS FOR DISCRIMINATORS AND THE LIKE

Bruce K. Nelson, Concord, Mass., assignor to AVCO Manufacturing Corporation, Cincinnati, Ohio, a corporation of Delaware Filed Mar. 2, 1959, Ser. No. 796,690
11 Claims. (Cl. 329—137)

Figure 1:
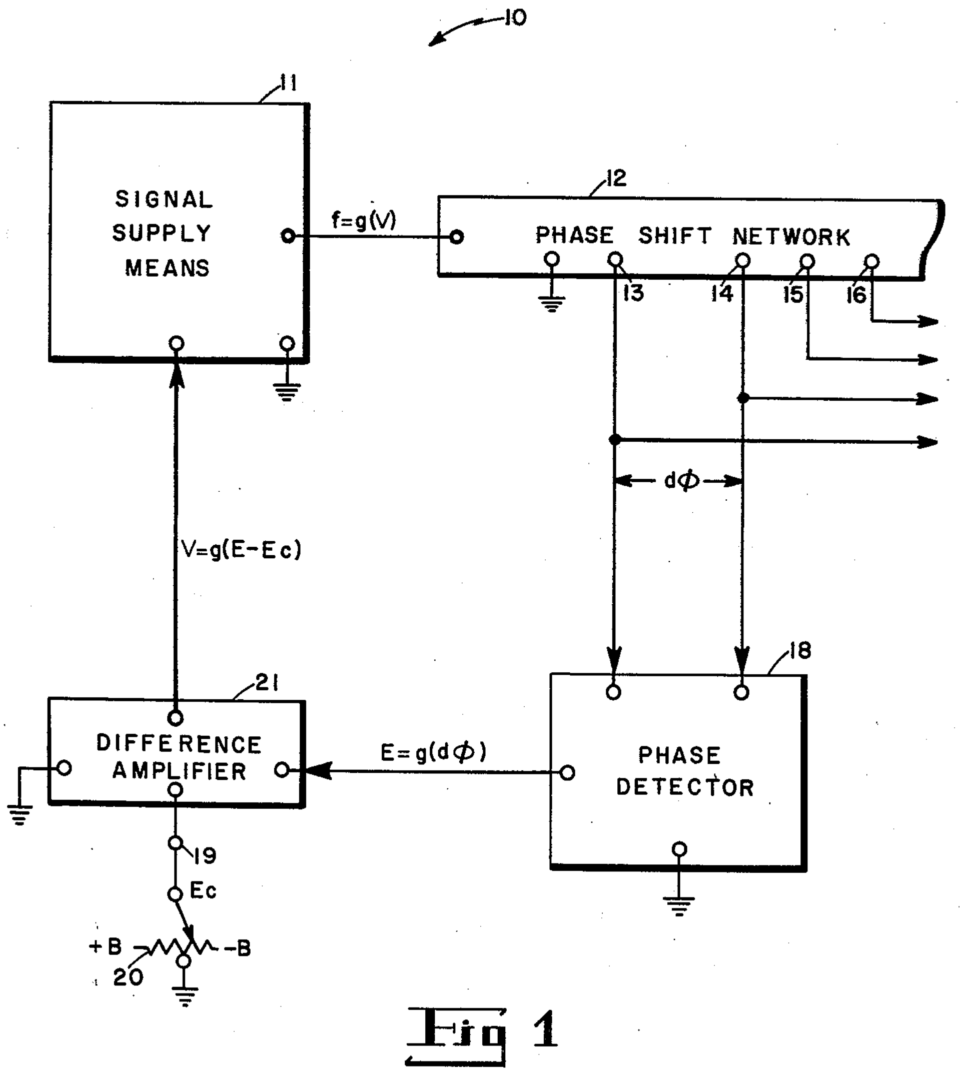

This invention relates to a system for controlling the phase difference between signals, or for controlling the frequency of a variable frequency signal generator. In both applications, this invention makes use of comparison signals whose phase difference is a function of their frequency.

It is an object of the invention to provide a control system for controlling the phase difference between two or more related signals.

It is another object of the invention to provide a control system for controlling the frequency of a variable frequency signal generator.

It is still another object of the invention to provide a control system for adjusting the phase difference of signals, whose phases are a function of the frequency of these signals. The control system acts to vary the frequency of these signals for adjusting the phase.

It is still another object of the invention to provide a frequency discriminator which operates over a wide band of frequencies.

It is another object of the invention to provide a frequency discriminator which first generates comparison signals having a phase difference which is a function of their frequency and then develops an output signal which is representative of the frequency of these signals.

A preferred embodiment of the invention comprises a control system having a signal supply means for providing a variable frequency signal. The control system also includes a signal translating means responsive to the variable frequency signal for providing comparison signals, having a phase difference which is a function of the frequency of the variable frequency signal. Circuit means are provided for comparing the comparison signals and for generating an output signal which is a function of the phase difference between the comparison signals. The aforementioned circuit means is a phase detector which is responsive to the phase difference between the comparison signals, and generates an output signal whose magnitude and polarity is representative of the phase difference. Means, comprising an input terminal, are provided for coupling a control signal, used for adjusting the phase difference to a predetermined value, to the control system. Finally, the control system includes means, comprising a difference amplifier, which is coupled to the input terminal and the phase detector, and responds to the control signal and the output signal for providing tuning signals. The tuning signal varies the frequency of the variable frequency signal until the magnitude of the output signal equals that of the control signal, at which time the phase difference between the comparison signals is adjusted to the selected difference.

In performing the control function, the control system makes use of a frequency discriminator. An important benefit gained from this frequency discriminator is its ability to operate over a wide band of frequencies, the upper and lower frequency limits being in the ratio of two to one. It also features simplicity of design and operational reliability.

Therefore, another object of this invention is to provide a frequency discriminator, comprising a signal translating means which responds to a variable frequency signal, for providing comparison signals having a phase difference which is a function of the frequency of the variable frequency signal. Normally the signal translating means will comprise a delay line having two taps from which signals having a specific phase difference may be derived. The frequency discriminator also includes circuit means, comprising a phase detector for comparing the phase difference between the comparison signals and generating an output signal which is a function of the phase difference. Since the phase difference is a function of the frequency of the signal applied to the signal translating means, it follows that the output signal, being a function of the phase difference, is also a function of the frequency.

Figure 2:
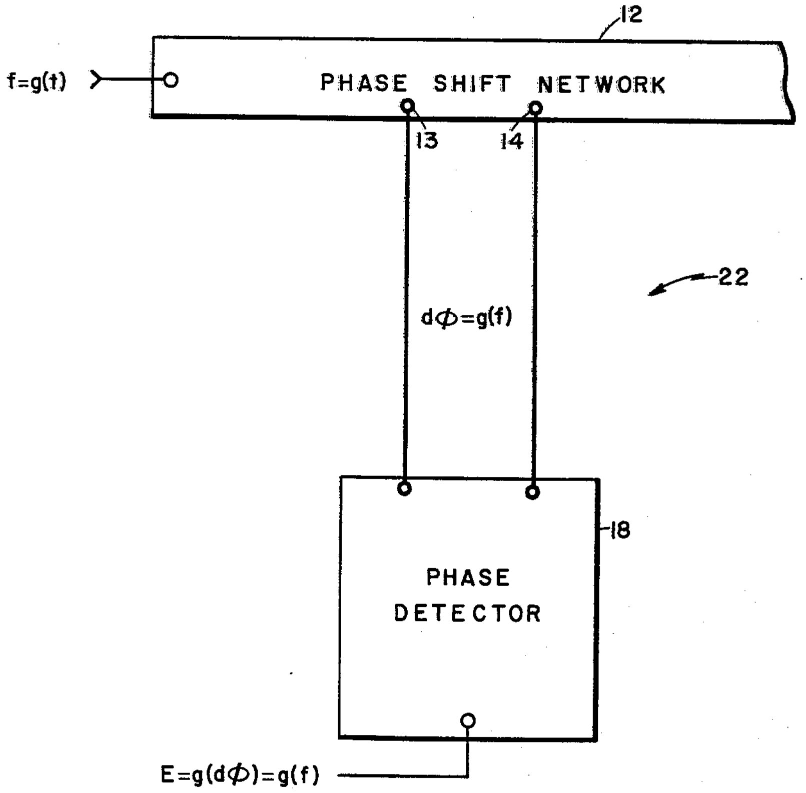

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

FIGURE 1 is a block diagram of a control system embodying the principles of the present invention; and FIGURE 2 shows a portion of the FIGURE 1 control system which comprises a frequency discriminator.

*Description of the FIGURE 1 Control System*

It will become clear hereinafter that the FIGURE 1 control system can function, without modification, to control the frequency of a variable frequency signal generator, or the phase difference between signals. Whether the control system performs one function or the other depends on the viewpoint one takes, or the significance attached to the control signal applied to the system.

Referring to FIGURE 1 of the drawings, there is shown a control system, generally designated 10 which embodies the principles of the present invention. The control system 10 includes a signal supply means 11 for providing a variable frequency signal. The signal supply means 11 may comprise, for example, a controlled variable frequency signal generator constructed as a reactance tube oscillator, or an oscillator whose frequency is varied by adjusting the D.C. voltage applied to a Varicap capacitor. Both of these circuits are well known in the art and will not be described in detail.

The control system 10 also includes means, comprising a phase shift network 12, which is coupled to the signal supply means 11, and responds to the signals supplied from the signal supply means 11 for providing comparison signals having a phase difference which is a function of the frequency of the applied signal. The phase shift network 12 may comprise, for example, a multi-tapped delay line or a wave guide, depending on the frequency used. It is well known, in either case, that the phase of the signals obtained at adjacent taps, in the delay line or the wave guide is a function of the frequency of the signal being translated therein. The phase shift network 12 includes a plurality of output terminals designated 13, 14, 15 and 16, from each of which can be obtained a comparison signal whose phases are related. In this discussion, the comparison signals will be derived from the adjacent terminals 13 and 14. The arrows coupling the output terminals 13 through 16 represent signals taken from the phase shift network for use in external equipment that require a plurality of signals having related phases.

A phase detector 18 is provided for comparing the comparison signals. The phase detector 18 is coupled to terminals 13 and 14 of the phase shift network 12 for receiving the comparison signals. Phase detector 18 is conventional in its design and operation. It generates an output signal whose magnitude and polarity is representative of the difference in phase of the comparison signals.

Means for providing a control signal for adjusting the phase difference to a predetermined value, comprises an input terminal 19. A suitable means for selecting a control signal may comprise a variable resistor 20 coupled between a source of negative and positive potential, —B and +B respectively. Assuming a uniform taper on the resistor 20, it is a simple matter to provide a uniform bipolarity voltage gradient along the resistor 20 by coupling the centerpoint to ground. Manifestly, resistor 20 is unnecessary if terminal 19 is coupled to a variable supply voltage whose amplitude and polarity is representative of the desired phase difference. Finally, the phase control system includes means coupled to the phase detector and the input terminal 19, which is responsive to the output signal and the control signal for providing the tuning signal which is a function of the control and tuning signals. This means may, for example, comprise a difference amplifier 21 whose output circuit means is coupled to the signal supply means 11.

*Operation of the Figure 1 Control System*

The operation of the FIGURE 1 control system will be discussed with regard to adjusting the phase difference, designated "$d\phi$," between the comparison signals derived from terminals 13 and 14 of the phase shift network 12.

Initially, it will be assumed that the control system 10 is adjusted to a phase difference "$d\phi$," the magnitude of which is determined by a control signal, designated "E*c*," applied to terminal 19. As will be seen hereinafter, "E*c*" is related to "$d\phi$" through its relationship to the output signal "E" from the phase detector 18. The relationship between "E" and "$d\phi$" is determined by calibrating the phase detector output "E" by applying to the input signals having known phase differences.

"E*c*" and "E" are compared in the difference amplifier 21 and a tuning signal, designated "V," is generated, where "V" is a function of the difference between "E*c*" and "E." See FIGURE 1 where "*g*" (V) denotes "function." It will also be shown that "V" is substantially zero at any adjusted value of "$d\phi$." Since we have assumed, as an initial condition, that the control system 10 is adjusted to a phase difference, it follows that initially "V" is substantially zero.

When it is desired to change the phase difference between the comparison signals, the magnitude of the control signal "E*c*" is changed. The previously mentioned zero condition is destroyed and a signal "V" is developed. The signal "V" acts as a tuning signal to change the frequency of the signal supply means 11 in a direction which, as will be seen hereinafter, tends to decrease the magnitude of "V". The output frequency, "*f*," of the signal supply means, shown as being equal to a function of "V" is applied to the input of the phase shift network 12. The comparison signals derived from the phase shift network 12 will now have a phase difference that is varying, in synchronism, with the rate of change of frequency of the signal from the signal supply means 11. The phase detector 18 acts upon this difference in phase and generates, in a conventional manner the signal "E" which is a function of the phase difference. See FIGURE 1. The magnitude of "E" is also varying as the frequency of the signal from the signal supply means is varied. It is varying in a direction tending to equal the magnitude of the control signal "E*c*." Clearly, therefore, the tuning signal "V" which is a function of the difference between the signal "E" and the control signal "E*c*" tends toward zero. When the tuning signal "V" has the proper value, the signal supply means 11 is supplying a signal to the phase shift network 12 whose frequency is such that the phase difference "$d\phi$" between the comparison signals derived from terminals 13 and 14 is adjusted essentially to the predetermined value and the difference between the signal "E" and the control signal "E*c*" is essentially zero.

It has been previously mentioned that the control system 10 acts as a phase control system or a frequency control system depending on the viewpoint. For purposes of this discussion the phase and frequency of a signal are considered to be variables of the signal. In the control system 10 the phase and frequency of the signal from the signal supply means 11 are related in the phase shift network. However, in accordance with this invention, the control of either variable may be the objective sought. For example, in the operation just discussed, the control voltage "E*c*" represented an independently selected difference in phase between the comparison signals 13 and 14 and the frequency of the signal obtained from the signal supply means 11 was varied under the control of the control signal "E*c*" until a selected phase difference was obtained. However, if the control signal "E*c*" denotes, or represents a specific frequency, the control system 10 utilizes the phase difference "$d\phi$," under the control of the control signal "E*c*" for adjusting the frequency of the signal obtained from the signal supply means.

*Description and Operation of the FIGURE 2 Frequency Discriminator*

Referring to FIGURE 2 of the drawings, there is shown a frequency discriminator generally designated 22, which comprises elements of the previously described control system 10. These elements comprise the phase shift network 12 and the phase detector 18. It has been previously mentioned that the output signal from the phase detector is a signal whose magnitude and polarity is representative of the phase difference between the comparison signals applied to its input. In the frequency discriminator 22, recognition is made of the fact that the phase difference between two taps on a phase shift network, is related to the frequency of the signal applied to the network. In this application the frequency is shown as a function of time, $g(t)$. Accordingly, in performing frequency discrimination, the discriminator 22 first develops a pair of comparison signals whose phase difference is a function of the frequencies of these signals, and then compares this phase difference for developing an output signal whose magnitude and polarity is representative of the phase difference, and consequently of the frequency.

As the frequency of the signal applied to the phase network is varied, the phase difference is varied. This phase difference is unambiguous until a frequency is reached where the phase difference developed is exactly 180° out of phase with the phase difference developed for an earlier signal. At this point an ambiguity arises because there is no way of determining whether the phase difference is due to the earlier or later signal. However, this 180° shift can represent a two to one difference in frequency, an extremely broad band for frequency discriminators.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. A phase control system comprising; signal supply means for providing a variable frequency signal; means responsive to the variable frequency signal for providing comparison signals having a phase difference which is a function of the frequency of the variable frequency signal; circuit means for comparing the comparison signals and generating an output signal that is a function of the phase difference between the comparison signals; means for providing a control signal for adjusting the phase difference to a predetermined value; and means responsive to the control signal and the output signal for providing a tuning signal which is a function of the control and the output signals for varying the frequency of the variable frequency signal supply means until the comparison signals have attained the preselected value.

2. A phase control system comprising: signal supply means for providing a variable frequency signal; a phase shift network coupled to said signal supply means for providing comparison signals having a phase difference which is a function of the frequency of the variable frequency signal; a phase detector coupled to said phase shift network for comparing the phase difference between the comparison signals and generating an output signal whose magnitude and polarity is a function of the phase difference; means for providing a control signal for adjusting the phase difference to a predetermined value; a difference amplifier responsive to the output signal and the control signal for generating a tuning signal whose magnitude is a function of the difference of the magnitudes of output and the control signals, the tuning signal varying the frequency of the variable frequency signal supply means to adjust the phase difference between the comparison signals.

3. A phase control system as described in claim 2 in which said phase shift network comprises a signal translating means having a plurality of output circuits, each of the output circuits providing a comparison signal.

4. A phase control system as described in claim 2 in which said phase shift network is a multi-tapped delay line, the comparison signals being provided at the taps of said delay line.

5. A frequency control system comprising: signal supply means for providing a variable frequency signal; means responsive to the variable frequency signal for providing comparison signals having a phase difference which is a function of the frequency of the variable frequency signal; circuit means for comparing the comparison signals and generating an output signal that is a function of the phase difference between the comparison signals; means for providing a control signal for adjusting the frequency of the variable frequency signal to a predetermined value; and means responsive to the control signal and the output signal for providing a tuning signal which is a function of the control and output signal for varying the frequency of the variable frequency signal supply means until it has the preselected value.

6. A frequency discriminator for a broad frequency band of signals comprising: siginal translating means comprising a multi-tapped delay line adapted to receive a signal having a frequency in the broad frequency band of signals for providing comparison signals at the taps of said multi-tap delay line having a phase difference that is a function of the frequency of the received signal and a phase detector coupled to said signal translating means fór comparing the phase difference between the comparison signals and generating an output signal the magnitude and polarity of which are a function of the phase difference.

7. A phase control system comprising: a signal supply means for supplying a variable frequency signal; means coupled to said signal supply means for receiving a variable frequency signal therefrom for providing comparison signals having a phase difference which is a function of the frequency of the received signal; means for generating a control signal for selecting a phase difference to which the comparison signals are to be adjusted; means coupled to the comparison signals for generating an output signal which is a function of the phase difference of the comparison signals; and comparison means coupled to said last-mentioned means and said selection means responsive to said output signal and said control signal for providing a tuning signal for tuning said variable frequency signal supply means for varying the frequency of the variable frequency signal.

8. A phase control system as described in claim 7 in which said selection means comprises a variable resistance means having a voltage gradient along the extent thereof.

9. A phase control system as described in claim 7 in which said selection means comprises a signal supply means for providing a signal which is representative of a selected phase difference.

10. A system for controlling a signal variable comprising: a signal supply means for supplying a frequency tunable signal; means coupled to said signal supply means and responsive to said tunable frequency signal for providing comparison signals having a phase difference which is a function of the frequency of the tunable frequency signal; means for selecting the magnitude of the variable to be controlled; and means coupled to the comparison signals for providing an output signal which is a function of the phase difference of the comparison signals; and means coupled to the output signal and the selection means for providing a tuning signal for varying the frequency of said signal supply means.

11. A control system as described in claim 10 in which said selection means comprises a signal supply means for providing a control signal which is representative of a selected value of the variable being controlled.

References Cited in the file of this patent

UNITED STATES PATENTS

| | | |
|---|---|---|
| 2,279,659 | Crosby | Apr. 14, 1942 |
| 2,279,660 | Crosby | Apr. 14, 1942 |
| 2,775,700 | Ring | Dec. 25, 1956 |
| 2,805,334 | Cayzac | Sept. 3, 1957 |
| 2,844,652 | Pinet | July 22, 1958 |
| 2,930,842 | Leyton | Mar. 29, 1960 |
| 2,935,609 | Rabin et al. | May 3, 1960 |